(12) United States Patent
Kobayashi et al.

(10) Patent No.: US 7,719,814 B2
(45) Date of Patent: May 18, 2010

(54) SEMICONDUCTOR DEVICE WITH SURGE PROTECTION CIRCUIT

(75) Inventors: Mutsuo Kobayashi, Itami (JP); Tsukasa Ooishi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 486 days.

(21) Appl. No.: 11/826,090

(22) Filed: Jul. 12, 2007

(65) Prior Publication Data

US 2008/0048767 A1    Feb. 28, 2008

(30) Foreign Application Priority Data

Jul. 12, 2006    (JP) ............................. 2006-191168

(51) Int. Cl.
*H02H 3/22* (2006.01)
*G11C 7/24* (2006.01)

(52) U.S. Cl. .................... 361/111; 365/189.06; 365/226

(58) Field of Classification Search ................. 361/111; 365/189.06, 226

See application file for complete search history.

(56) References Cited

U.S. PATENT DOCUMENTS

| | | | |
|---|---|---|---|
| 4,399,521 A * | 8/1983 | Masuda ...................... 365/180 |
| 5,040,151 A * | 8/1991 | Miyawaki et al. ............ 365/226 |
| 5,991,221 A * | 11/1999 | Ishikawa et al. ............. 365/226 |
| 6,301,167 B1 * | 10/2001 | Lee et al. ..................... 365/201 |
| 6,327,212 B1 * | 12/2001 | Ishikawa et al. ............. 365/226 |
| 6,407,959 B2 * | 6/2002 | Ishikawa et al. ............. 365/226 |
| 2005/0041481 A1* | 2/2005 | Koelling et al. ......... 365/189.06 |

FOREIGN PATENT DOCUMENTS

| | | |
|---|---|---|
| JP | 2002-350500 | 12/2002 |
| JP | 2004-164811 | 6/2004 |

* cited by examiner

*Primary Examiner*—Ronald W Leja
(74) *Attorney, Agent, or Firm*—McDermott Will & Emery LLP

(57) ABSTRACT

A semiconductor device includes a memory cell to and from which data is written and read in accordance with voltage supplied, a power supply circuit generating the voltage supplied to the memory cell, a microcomputer, an external terminal, a surge protection circuit clamping at a predetermined voltage value a voltage supplied to the external terminal, and a first switch circuit switching to output to one of the power supply circuit and the microcomputer a voltage having passed through the surge protection circuit. The power supply circuit includes a voltage conversion circuit changing the magnitude of a voltage received from the first switch circuit, and a second switch circuit switching to supply the memory cell with one of the voltage received from the first switch circuit and the voltage changed in magnitude.

5 Claims, 3 Drawing Sheets

SEMICONDUCTOR DEVICE WITH SURGE PROTECTION CIRCUIT

BACKGROUND OF THE INVENTION

1. Field of the Invention

The present invention relates to semiconductor devices and particularly to semiconductor devices including memory cells to and from which data is written and read, respectively, in accordance with voltage supplied.

2. Description of the Background Art

There has been developed a nonvolatile semiconductor memory device including a floating gate (FG) that can receive electrons or have electrons removed therefrom to store information, such as a semiconductor device having flash memory incorporated therein. Flash memory includes memory cells having a floating gate, a control gate (CG), a source, a drain, and a well or substrate. The memory cell has a threshold voltage, which increases when the floating gate receives electrons, and decreases when the floating gate has electrons removed therefrom (see Japanese Patent Laying-open No. 2004-164811 for example.)

Generally, when a memory cell has a threshold voltage falling within the lowest voltage distribution, the memory cell is in an erased state. Furthermore, when the memory cell has a threshold voltage falling within a distribution higher than the erased state, the memory cell is in a written state. For example, if the memory cell stores two bits of data, the threshold voltage distribution lowest in voltage corresponds to a logic level "11" and this state is referred to as an erased state. The memory cell is subjected to a write operation and has a threshold voltage rendered higher than the erased state to obtain threshold voltages corresponding to logic levels "10", "01" and "00". This state is referred to as a written state.

Although it does not have flash memory incorporated therein, Japanese Patent Laying-open No. 2002-350500, for example, discloses such a semiconductor device as follows: More specifically, a charge pump circuit in operation supplies an internal voltage line with negative electrical charge to decrease negative internal voltage. A voltage division circuit generates a control voltage in accordance with a difference in voltage between a first positive voltage received in a test mode externally at an input terminal and internal voltage. A comparison circuit causes the charge pump circuit to operate in accordance with a result of comparing a second positive voltage received in the test mode externally at an input terminal with the control voltage. The second positive voltage is set in accordance with a target negative internal voltage. By such configuration, externally input negative voltage can be prevented by a protection diode from being applied to an internal circuit, and negative voltage can be generated in the internal circuit and used in the test mode.

Flash memory incorporated semiconductor devices have their flash memory modules tested by measuring their memory cells' threshold voltage. More specifically in this test a read voltage is supplied from a pad of the semiconductor device to a memory cell of a flash memory module and the read voltage is gradually increased. A read voltage that allows data stored in the memory cell to be read is the memory cell's threshold voltage.

Furthermore, to be more reliable, semiconductor devices have a surge protection circuit connected to a pad thereof. The semiconductor devices are tested for reliability by measuring surge endurance. If the semiconductor device has a flash memory module sharing a pad with a microcomputer or a similar circuit that requires surge protection, the surge protection circuit is also connected to the pad. In that case, when a memory cell's threshold voltage is to be measured, a read voltage will be supplied to the pad to which the surge protection circuit is connected. The surge protection circuit clamps a voltage exceeding a predetermined value, and if the read voltage exceeds the predetermined value, it cannot be supplied to the memory cell, and the memory cell's threshold voltage cannot be measured. Conventional semiconductor devices thus disallow a surge protection circuit to be connected to a pad required to receive high voltage, and are thus difficult to be enhanced in reliability.

Furthermore, the semiconductor device of Japanese Patent Laying-open No. 2002-350500 requires two external input terminals to generate a negative voltage used in the test mode. The semiconductor device is thus difficult to miniaturize.

SUMMARY OF THE INVENTION

The present invention contemplates a semiconductor device that is more reliable and can also be miniaturized.

The present invention in one aspect provides a semiconductor device including a memory cell to and from which data is written and read in accordance with voltage supplied, a power supply circuit generating the voltage supplied to the memory cell, a microcomputer, an external terminal, a surge protection circuit clamping at a predetermined voltage value a voltage supplied to the external terminal, and a first switch circuit switching to output to one of the power supply circuit and the microcomputer a voltage having passed through the surge protection circuit. The power supply circuit includes a voltage conversion circuit changing the magnitude of a voltage received from the first switch circuit, and a second switch circuit switching to supply the memory cell with one of the voltage received from the first switch circuit and the voltage changed in magnitude.

The present invention can thus achieve enhanced reliability and miniaturization.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the present invention will be described in embodiments with reference to the drawings. In the figures, identical or like components are identically denoted and will not be described repeatedly.

First Embodiment

Configuration and Basic Operation

Figure 1:
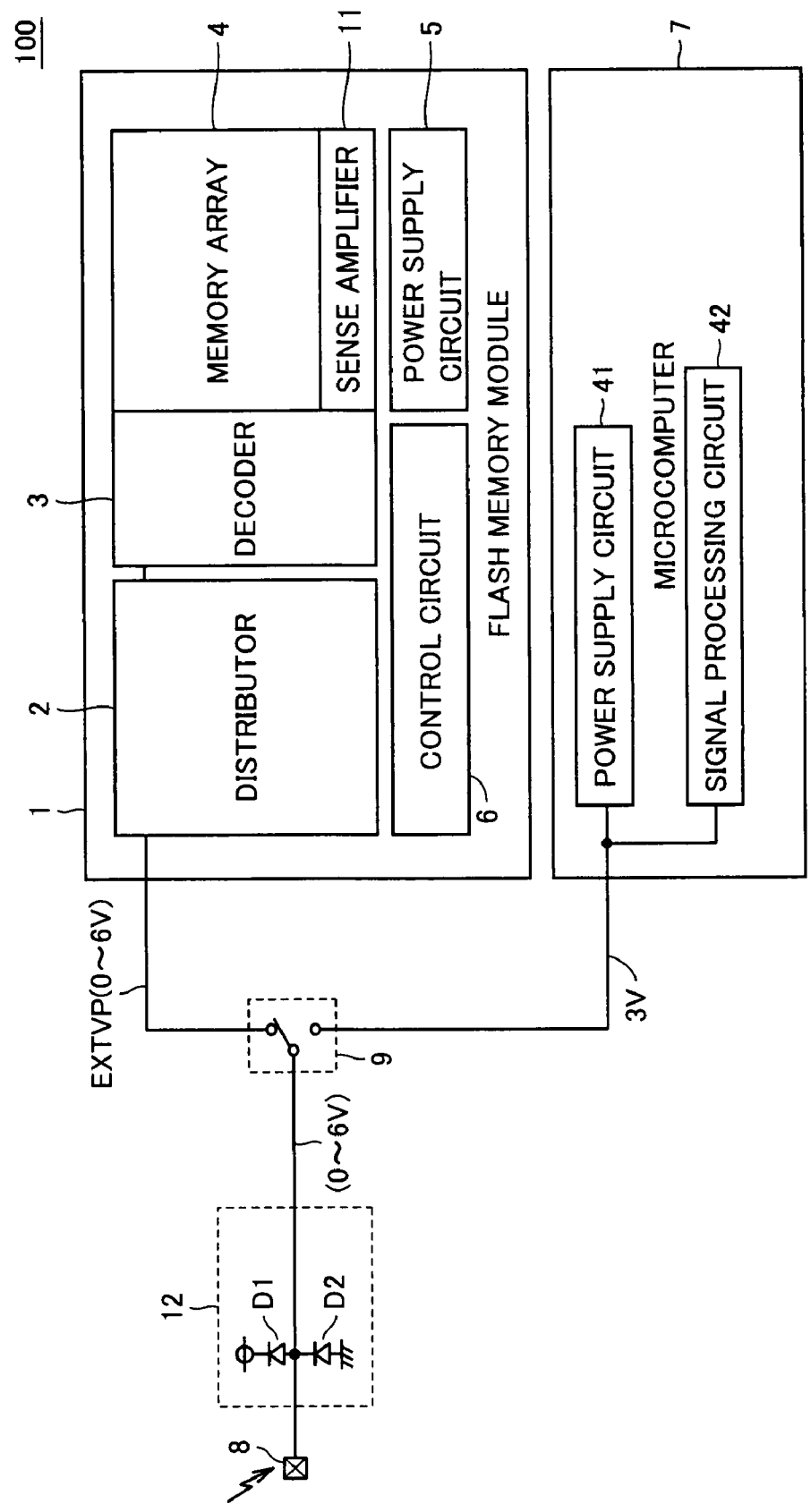
FIG. 1 shows a configuration of the present semiconductor device in a first embodiment.

FIG. 1 shows a configuration of the present semiconductor device in a first embodiment.

With reference to FIG. 1 a semiconductor device 100 includes a flash memory module 1, a microcomputer 7, a pad (or an external terminal) 8, a port switching circuit (or a first switch circuit) 9, and a surge protection circuit 12. Flash memory module 1 includes a distributor 2, a decoder 3, a memory array 4, a power supply circuit 5, a control circuit 6, and a sense amplifier 11. Surge protection circuit 12 includes diodes D1 and D2. Diodes D1 and D2 have an anode and a cathode, respectively, connected to pad 8. Diode D1 has a cathode connected to a fixed potential and diode D2 has an anode connected to a ground potential.

Microcomputer 7 includes a power supply circuit 41 and a signal processing circuit 42. Microcomputer 7 controls each block, such as flash memory module 1, in semiconductor device 100, and processes operations.

Flash memory module 1 operates in response to address and command signals received from outside of flash memory module 1, i.e., semiconductor device 100, or received from microcomputer 7 to store externally received data and externally output stored data.

Memory array 4 includes a plurality of memory cells storing data in a non-volatile manner. Data are written to and read from the memory cells in accordance with voltage supplied.

Power supply circuit 5 is controlled by control circuit 6 to generate a voltage supplied to the memory cells of memory array 4 and output the generated voltage via distributor 2 to decoder 3.

The externally received address signal is input to decoder 3. The externally received data and command signal are input to control circuit 6.

Control circuit 6 operates in accordance with the externally received data and command signal to output a control signal to each circuit to control it to write and read data to and from a memory cell.

Decoder 3 decodes the externally received address signal to select a word line, a source line, a bit line and a well that correspond to a particular memory cell of memory array 4. This specifies a memory cell to which data is to be written and a memory cell from which data is to be read. Decoder 3 then drives the selected word line, source line, bit line and well by the voltage received from power supply circuit 5. Note that the memory cell has its control gate, drain and source connected to the word line, bit line and source line, respectively.

Control circuit 6 controls power supply circuit 5 and sense amplifier 11 to read data from a memory cell of memory array 4. More specifically, sense amplifier 11 is connected to the bit lines of the plurality of memory cells of memory array 4. When data is to be read, a particular memory cell is selected by a word line, a bit line, and the like selected by decoder 3 in accordance with the externally received address signal. Decoder 3 applies to the selected word line the voltage received from power supply circuit 5. Sense amplifier 11 determines whether a memory cell connected to the selected word line has data of 0 or 1 stored therein from whether the memory cell passes a current larger or smaller than a predetermined value.

For example, if the memory cell stores one bit of data, and has a threshold voltage larger than a voltage applied to the word line, the memory cell less readily passes a current, and sense amplifier 11 determines that the memory cell has data of 0 stored therein. If the memory cell has a threshold voltage smaller than the voltage applied to the word line, the memory cell readily passes a current, and sense amplifier 11 determines that the memory cell has data of 1 stored therein.

Control circuit 6 controls power supply circuit 5 and decoder 3 to write data to a memory cell of memory array 4. For example, if the memory cell stores 2 bits of data, writing to the memory cell is done by utilizing the channel hot electron (CHE) phenomenon to inject electrons into the floating gate to gradually increase a threshold voltage, i.e., increase a threshold voltage distribution corresponding to "11", i.e., an erased state, to those corresponding to "10", "01" and "00". Control circuit 6 thus allows data to be written by setting a threshold voltage of a memory cell to which data is to be written, at a threshold voltage corresponding to a logical level of externally received data.

Surge protection circuit 12 clamps at a predetermined voltage value an external voltage supplied from outside of semiconductor device 100 to pad 8, i.e., prevents a subsequent circuit from receiving a voltage equal to or larger than the predetermined value. For example, surge protection circuit 12 clamps a voltage at 6 V to prevent microcomputer 7 from receiving excessive voltage and does not output to port switching circuit 9 a voltage exceeding 6 V. Note that the external voltage may be negative voltage. More specifically, surge protection circuit 12 may be configured to clamp at a predetermined voltage value a negative voltage supplied from outside of semiconductor device 100 to pad 8, i.e., prevent a subsequent circuit from receiving a voltage equal to or smaller than the predetermined value.

Port switching circuit 9 switches to output a voltage that has passed through surge protection circuit 12 to flash memory module 1 or microcomputer 7.

When pad 8 is used to supply microcomputer 7 with power supply voltage, an external voltage for example of 3 V is supplied from outside of semiconductor device 100 to pad 8. Port switching circuit 9 outputs the voltage of 3 V that has passed through surge protection circuit 12 to power supply circuit 41 of microcomputer 7. Power supply circuit 41 exactly supplies the voltage of 3 V that is received from port switching circuit 9 to each block of microcomputer 7, or converts the voltage and thus supplies it to each block of microcomputer 7.

When pad 8 is used to input a signal to microcomputer 7, a signal for example having an amplitude of 3 V is received from a device external to semiconductor device 100 to pad 8. Port switching circuit 9 outputs the signal, or a voltage having passed through surge protection circuit 12, to signal processing circuit 42 of microcomputer 7. Signal processing circuit 42 operates in accordance with the signal received from port switching circuit 9 to process a signal.

Figure 2:
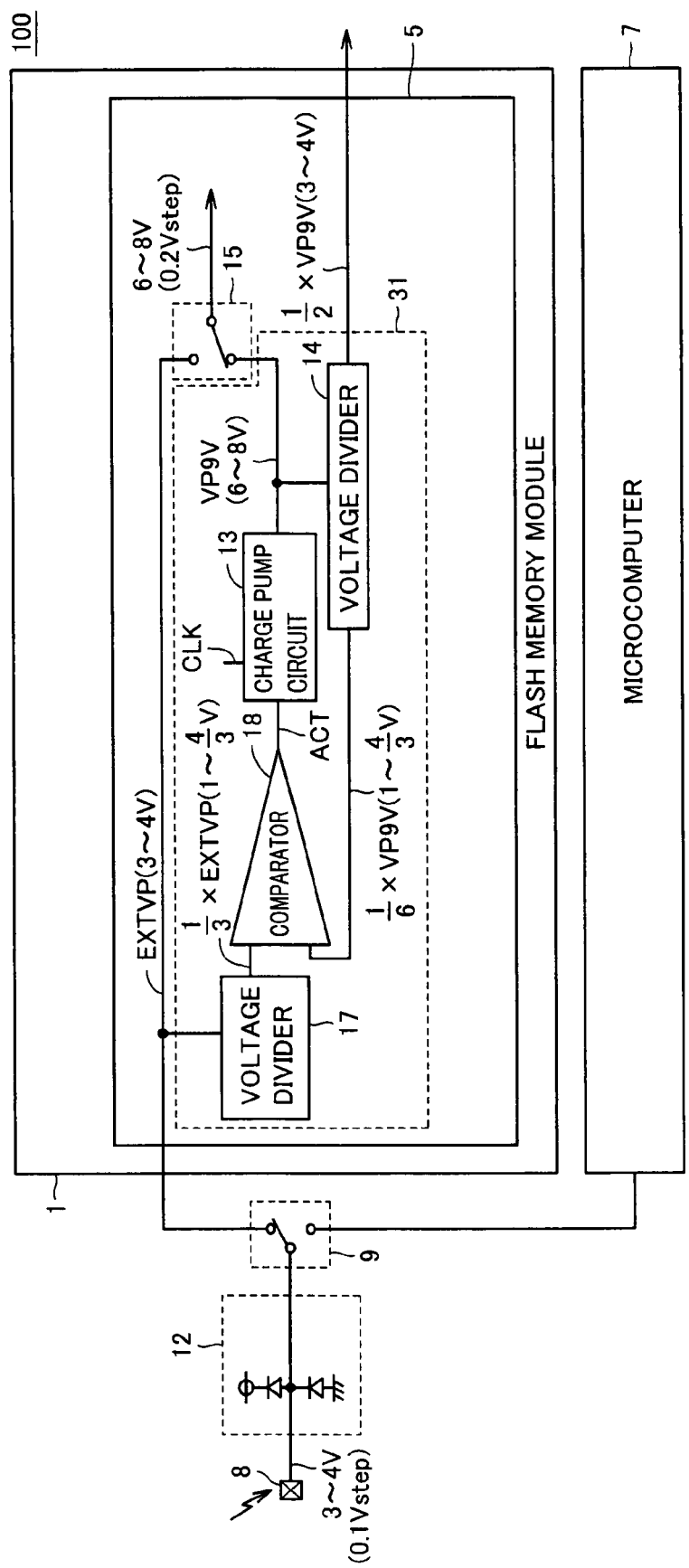
FIG. 2 specifically shows a configuration of a power supply circuit in the present semiconductor device of the first embodiment.

FIG. 2 specifically shows a configuration of a power supply circuit in the present semiconductor device of the first embodiment. While hereinafter power supply circuit 5 will be described as generating a voltage supplied to a word line of a memory cell, it is not limited thereto, and a voltage supplied to the memory cell's source line, bit line, well and the like may be generated by the configuration shown in FIG. 2.

With reference to FIG. 2, power supply circuit 5 includes a voltage conversion circuit 31 and a switch circuit 15. Voltage conversion circuit 31 includes a voltage divider 17, a comparator 18, a voltage divider 14, and a charge pump circuit 13.

Voltage conversion circuit 31 increases a voltage received from port switching circuit 9 and outputs the increased voltage to switch circuit 15.

Switch circuit 15 is controlled by control circuit 6 to switch to supply a word line of a memory cell with an external voltage supplied to pad 8 or the voltage increased by voltage conversion circuit 31.

Operation

Hereinafter an operation of voltage conversion circuit 31 that increases an external voltage and a method of measuring a threshold voltage of a memory cell will be described with specific numerical values.

For example, voltage conversion circuit 31 doubles an external voltage supplied to pad 8 and thus outputs it to switch circuit 15.

More specifically, pad 8 receives an external voltage for example of 3 V to 4 V, which is in turn input via surge protection circuit 12, port switching circuit 9 and the FIG. 1 distributor 2 as a voltage EXTVP to voltage divider 17.

Voltage divider 17 divides voltage EXTVP by three to provide a voltage of 1 V to 4/3 V which is in turn output to comparator 18.

Comparator 18 compares the voltage received from voltage divider 17, i.e., a voltage of 1/3 of voltage EXTVP, with a voltage received from voltage divider 14, i.e., a voltage of 1/6 of a pump output voltage VP9V. More specifically, if the voltage of 1/3 of voltage EXTVP is larger than that of 1/6 of pump output voltage VP9V, comparator 18 outputs a signal ACT of the high level to charge pump circuit 13. if the voltage of 1/3 of voltage EXTVP is equal to or smaller than that of 1/6 of pump output voltage VP9V, comparator 18 outputs signal ACT of the low level to charge pump circuit 13. This operation of comparator 18 is represented by the following expressions:

| | |
|---|---|
| EXTVP × 1/3 > VP9V × 1/6 | ... ACT = high |
| EXTVP × 1/3 ≦ VP9V × 1/6 | ... ACT = low. |

If charge pump circuit 13 receives signal ACT of the high level from comparator 18, i.e., if pump output voltage VP9V does not reach voltage EXTVP multiplied by two, charge pump circuit 13 is activated to increase pump output voltage VP9V. If charge pump circuit 13 receives signal ACT of the low level from comparator 18, charge pump circuit 13 is inactivated to stop increasing pump output voltage VP9V and hold pump output voltage VP9V at the current voltage value, i.e., a voltage value equal to voltage EXTVP multiplied by two. Charge pump circuit 13 thus outputs pump output voltage VP9V, which is in turn input to switch circuit 15 and voltage divider 14. Note that semiconductor device 100 may have charge pump circuit 13 replaced with a volts direct current (VDC) circuit.

Voltage divider 14 receives pump output voltage VP9V of 6 V to 8 V from charge pump circuit 13, divides the voltage by six, and outputs the divided voltage to comparator 18. Furthermore, voltage divider 14 also divides pump output voltage VP9V received from charge pump circuit 13 by two and outputs the divided voltage as a monitor voltage of 3 V to 4 V to outside of semiconductor device 100. The monitor voltage can be measured with a tester or the like to confirm that the voltage of voltage EXTVP multiplied by two is normally applied to a word line of a memory cell. Charge pump circuit 13 may be configured to output pump output voltage VP9V of 6 V to 8 V as a monitor voltage for output outside of semiconductor device 100.

The present invention in the first embodiment provides a semiconductor device supplying a word line of a memory cell of memory array 4 with a voltage of 0 V increased to 8 V gradually by 0.2 V to measure the memory cell's threshold voltage. Surge protection circuit 12 clamps voltage at 6 V and does not output to port switching circuit 9 a voltage exceeding 6 V.

Accordingly, if a voltage of 0 V to 6 V is supplied to a word line of a memory cell, switch circuit 15 selects voltage EXTVP and supplies the voltage to the word line of the memory cell. If a voltage of 6 V to 8 V is supplied to the word line of the memory cell, switch circuit 15 selects a voltage increased by voltage conversion circuit 31, i.e., pump output voltage VP9V, and supplies the voltage to the word line of the memory cell. In this case, if a voltage of 3 V to 4 V is supplied to pad 8, as has been described previously, a voltage of 6 V to 8 V can be supplied to the word line of the memory cell.

Conventional semiconductor devices cannot have a surge protection circuit connected to a pad required to receive high voltage, and they have thus been difficult to be enhanced in reliability. The present semiconductor device in the first embodiment includes voltage conversion circuit 31 that can increase an external voltage supplied to pad 8 and output the increased voltage to switch circuit 15. Switch circuit 15 switches to supply a word line of a memory cell with the external voltage supplied to pad 8 or the voltage increased by voltage conversion circuit 31. Thus if a flash memory module and a microcomputer or a similar circuit that requires surge protection share a pad a high read voltage can be supplied to a memory cell regardless of the surge protection circuit's clamping operation. The present semiconductor device in the first embodiment thus allows a surge protection circuit to be connected to a pad required to receive high voltage and can thus be enhanced in reliability.

The semiconductor device of Japanese Patent Laying-open No. 2002-350500 requires two external input terminals to generate a negative voltage used in a test mode, and is thus difficult to miniaturize. The present semiconductor device in the first embodiment for example only requires a single pad or external input terminal used to supply a read voltage to measure a threshold voltage of a memory cell of memory array 4, and can accordingly be miniaturized.

Note that while the present semiconductor device in the first embodiment includes voltage conversion circuit 31 configured to increase a positive voltage supplied to pad 8 and output the increased positive voltage to switch circuit 15, it is not limited thereto. Voltage conversion circuit 31 can be configured to provide a negative multiple of a positive voltage supplied to pad 8, to generate a negative voltage and output the negative voltage to switch circuit 15. Furthermore, a negative voltage may be supplied as an external voltage to pad 8 of semiconductor device 100, and voltage conversion circuit 31 may be configured to generate a voltage smaller in value than the external voltage of the negative voltage, i.e., decrease the external voltage and output it to switch circuit 15.

Furthermore, while memory array 4 in the present semiconductor device of the first embodiment is described as including a plurality of memory cells storing data in a non-volatile manner, it is not limited thereto. Semiconductor device 100 may include a dynamic random access memory (DRAM) module, rather than flash memory module 1, i.e., memory array 4 may have memory cells having a DRAM structure.

In general, to previously remove an initial failure, a device is operated for a period of time and thus acceleratedly aged and thus screened to remove a defective product. One technique currently employed to screen DRAM is a high temperature operation test (or burn-in test). Generally in the burn-in test a device receives an external power supply voltage higher than in normal operation. Semiconductor device 100 that includes a DRAM module rather than flash memory module 1 can also be enhanced in reliability and miniaturized by the application of the present invention thereto.

The present invention in another embodiment will be described hereinafter with reference to the drawings. In the figures, identical or like components are identically denoted and will not be described repeatedly.

Second Embodiment

The present embodiment corresponds to the semiconductor device of the first embodiment plus a limiter circuit.

Figure 3:
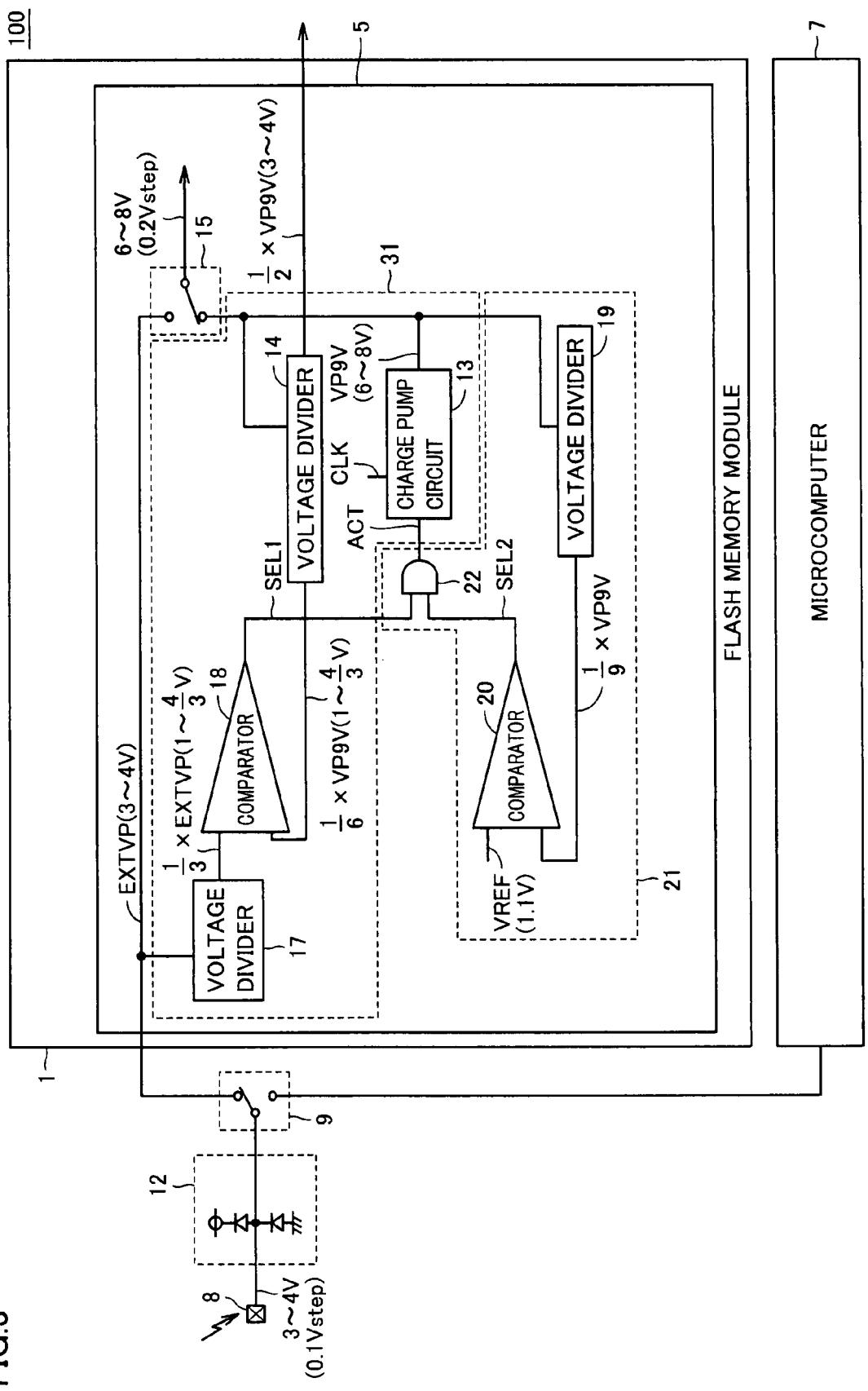
FIG. 3 specifically shows a configuration of a power supply circuit in the present semiconductor device of a second embodiment.

FIG. 3 specifically shows a configuration of a power supply circuit in the present semiconductor device of the second embodiment.

With reference to FIG. 3, power supply circuit 5 includes voltage conversion circuit 31, switch circuit 15, and a limiter circuit 21 including a voltage divider 19, a comparator 20 and an AND gate 22.

Comparator 18, as well as that of the semiconductor device of the first embodiment, compares a voltage received from voltage divider 17, i.e., a voltage of ⅓ of voltage EXTVP, with a voltage received from voltage divider 14, i.e., a voltage of ⅙ of pump output voltage VP9V, and in accordance with a result of the comparison outputs a signal SEL1 of the high or low level to AND gate 22.

Charge pump circuit 13 operates in response to signal ACT received from AND gate 22 to increase pump output voltage VP9V. Charge pump circuit 13 outputs pump output voltage VP9V which is in turn input to switch circuit 15 and voltage dividers 14 and 19.

Limiter circuit 21 controls voltage conversion circuit 31 to prevent a voltage output from voltage conversion circuit 31, i.e., pump output voltage VP9V output from charge pump circuit 13, from exceeding a predetermined voltage value. In other words, limiter circuit 21 controls voltage conversion circuit 31 to prevent voltage EXTVP from increasing over a predetermined voltage value.

In limiter circuit 21 voltage divider 19 receives pump output voltage VP9V of 6 V to 8 V from charge pump circuit 13 and divides the voltage by nine to provide a voltage of ⅔ V to ⅚ V which is in turn output to comparator 20.

Comparator 20 compares the voltage received from voltage divider 19, i.e., a voltage of ⅑ of pump output voltage VP9V, with a reference voltage VREF. More specifically, if ⅑ of pump output voltage VP9V is equal to or smaller than reference voltage VREF, comparator 20 outputs a signal SEL2 of the high level to AND gate 22. If ⅑ of pump output voltage VP9V is larger than reference voltage VREF, comparator 20 outputs signal SEL2 of the low level to AND gate 22. This operation of comparator 20 is represented by the following expressions:

| | |
|---|---|
| VP9V × ⅑ ≦ 1.1 V | ... SEL2 = high |
| VP9V × ⅑ > 1.1 V | ... SEL2 = low. |

AND gate 22 outputs a logical product of SEL1 received from comparator 18 and SEL2 received from comparator 20 as signal ACT to charge pump circuit 13.

Herein if memory array 4 has memory cells having a breakdown voltage of 10 V, reference voltage VREF can be set at 1.1 V.

More specifically, if pump output voltage VP9V is equal to or smaller than 9.9 V, comparator 20 outputs signal SEL2 of the high level and signal SEL1 output from comparator 18 is output as signal ACT from AND gate 22 to charge pump circuit 13.

In contrast, if pump output voltage VP9V is larger than 9.9 V, comparator 20 outputs signal SEL2 of the low level, and regardless of which logical level signal SEL1 output from comparator 18 has, signal ACT of the low level is output from AND gate 22 to charge pump circuit 13. In that case, charge pump circuit 13 stops increasing pump output voltage VP9V and holds pump output voltage VP9V at the current voltage value. Such configuration can prevent pump output voltage VP9V from increasing over 9.9 V.

In the semiconductor device of the first embodiment, a voltage of twice an external voltage supplied to pad 8 is automatically applied to a word line of a memory cell, and a voltage exceeding the memory cell's breakdown voltage may be inadvertently applied to the word line. For example, if the memory cell has a breakdown voltage of 10 V, and an external voltage of 6 V is inadvertently supplied to pad 8, then a voltage of 12 V will be applied to the word line of the memory cell and may destroy the memory cell. The present semiconductor device in the second embodiment that includes limiter circuit 21 can set an upper limit for a voltage supplied to the memory cell and thus prevent the memory cell from receiving a voltage exceeding its breakdown voltage.

The remainder in configuration and operation of the semiconductor device in the second embodiment is similar to that of the semiconductor device in the first embodiment. The semiconductor device in the second embodiment, as well as that of the first embodiment, can ensure reliability and be miniaturized.

Note that as well as that of the first embodiment, the semiconductor device in the second embodiment can also have voltage conversion circuit 31 configured to provide a negative multiple of a positive voltage supplied to pad 8, to generate a negative voltage and output the negative voltage to switch circuit 15. Furthermore, a negative voltage may be supplied as an external voltage to pad 8 of semiconductor device 100, and voltage conversion circuit 31 may be configured to decrease the external voltage of the negative voltage. In those cases, limiter circuit 21 controls voltage conversion circuit 31 to prevent voltage EXTVP from decreasing to be smaller than a predetermined voltage value.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
  a memory cell to and from which data is written and read in accordance with voltage supplied;
  a power supply circuit generating said voltage supplied to said memory cell;
  a microcomputer;
  an external terminal;
  a surge protection circuit clamping at a predetermined voltage value a voltage supplied to said external terminal; and
  a first switch circuit switching to output to one of said power supply circuit and said microcomputer a voltage having passed through said surge protection circuit, wherein said power supply circuit includes:
    a voltage conversion circuit changing the magnitude of a voltage received from said first switch circuit; and a second switch circuit switching to supply said memory cell with one of said voltage received from said first switch circuit and said voltage changed in magnitude.

2. The semiconductor device according to claim 1, wherein:

said voltage conversion circuit increases said voltage received from said first switch circuit; and said power supply circuit further includes a limiter circuit controlling said voltage conversion circuit to prevent said voltage received from said first switch circuit from increasing over a predetermined voltage value.

3. The semiconductor device according to claim 1, wherein:

said voltage conversion circuit decreases said voltage received from said first switch circuit; and said power supply circuit further includes a limiter circuit controlling said voltage conversion circuit to prevent said voltage received from said first switch circuit from decreasing to be smaller than a predetermined voltage value.

4. The semiconductor device according to claim 1, wherein said voltage conversion circuit outputs to outside the semiconductor device said voltage changed in magnitude.

5. The semiconductor device according to claim 1, wherein said memory cell stores data in a non-volatile manner.

* * * * *